United States Patent
Rao et al.

(10) Patent No.: US 7,579,238 B2
(45) Date of Patent: *Aug. 25, 2009

(54) METHOD OF FORMING A MULTI-BIT NONVOLATILE MEMORY DEVICE

(75) Inventors: Rajesh A. Rao, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 425 days.

This patent is subject to a terminal disclaimer.

(21) Appl. No.: 11/668,210

(22) Filed: Jan. 29, 2007

(65) Prior Publication Data

US 2008/0182377 A1    Jul. 31, 2008

(51) Int. Cl.
*H01L 21/336* (2006.01)

(52) U.S. Cl. ............... 438/257; 257/317; 257/E29.3

(58) Field of Classification Search ............ 438/201, 438/257, 263, 264, 962; 257/314, 315, 317, 257/320, 321, E29.3
See application file for complete search history.

(56) References Cited

U.S. PATENT DOCUMENTS

| | | | |
|---|---|---|---|
| 6,855,979 B2 | 2/2005 | Sadd et al. | |
| 6,958,265 B2 * | 10/2005 | Steimle et al. | 438/211 |
| 7,446,371 B2 * | 11/2008 | Kim | 257/321 |
| 2004/0185621 A1 | 9/2004 | Sadd et al. | |

OTHER PUBLICATIONS

Lek, Chun Meng et al.; Impact of decoupled plasma nitridation of ultra-thin gate oxide on the performance of p-channel MOSFETs; Semiconductor Science Technology 17; 2002; pp. 1.25-1.28; Semiconductor Science and Technology, Institute of Physics Publishing.

* cited by examiner

*Primary Examiner*—David Vu
(74) *Attorney, Agent, or Firm*—Robert L. King; James L. Clingan, Jr.

(57) ABSTRACT

In making a multi-bit memory cell, a first insulating layer is formed over a semiconductor substrate. A second insulating layer is formed over the first insulating layer. A layer of gate material is formed over the second insulating layer and patterned to leave a gate portion. The second insulating layer is etched to undercut the gate portion and leave a portion of the second insulating layer between the first insulating layer and the gate portion. Nanocrystals are formed on the first insulating layer. A first portion of the nanocrystals is under the gate portion on a first side of the portion of the second insulating layer and a second portion of the nanocrystals is under the gate portion on a second side of the portion of the second insulating layer. The first and second portions of the nanocrystals are for storing logic states of first and second bits, respectively.

20 Claims, 5 Drawing Sheets

… (1)

METHOD OF FORMING A MULTI-BIT NONVOLATILE MEMORY DEVICE

BACKGROUND

1. Field

This disclosure relates generally to semiconductors, and more specifically, to a process for manufacturing a semiconductor data storage device.

2. Related Art

Silicon nanodots or nanoclusters have been proposed for use in semiconductors to form nonvolatile memory devices. Additionally, others have taught the use of silicon nanoclusters in nonvolatile memory devices that store two bits of information per memory cell where a memory cell is implemented as a single transistor. In one approach a single continuous layer of silicon nanoclusters is used to store two bits because the nanocrystals are not electrically continuous. Charge is placed and stored at opposite ends of the single continuous layer in a memory transistor to implement the two stored bits of information and no charge is present in the middle of the continuous layer. However, random fluctuations in any of the silicon nanocluster size or the nanocluster density (i.e. nanocluster spacing) can result in lateral charge transport within the continuous nanocluster layer. The lateral charge transport results in disturbed data bits and unreliable data storage.

An alternative implementation of a nanocluster memory device that stores two data bits per device uses a discontinuous layer of nanoclusters to avoid the lateral charge transport described above. However, the known methods of making a two-bit per memory cell device with nanoclusters being present only near the source and the drain region of the device typically require additional semiconductor masking steps to manufacture and are thus more costly to implement. The additional masking step(s) is required to remove nanoclusters from the center of the memory device. Additionally, such devices are laterally larger in size. Further, some known devices with separated storage regions of nanoclusters are limited in the thickness of the gate dielectric in the center of the memory device. Thus, such devices are limited in the amount of voltage that may be applied to the devices. The voltage limitation is problematic as typically erase voltages must be high for such devices and the erase voltage value may damage or rupture the thin gate dielectrics.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
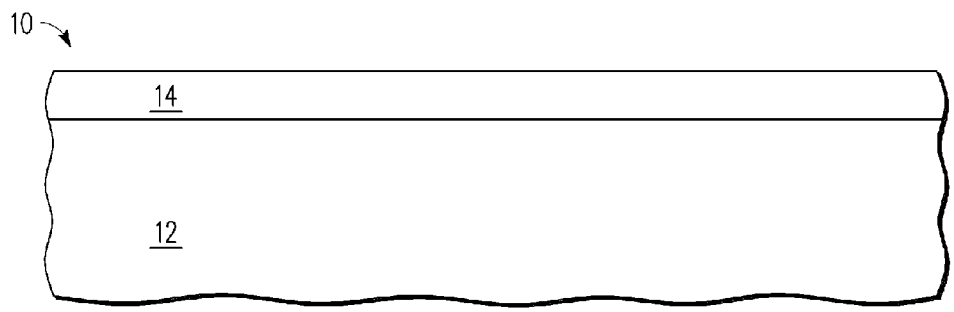
FIGS. 1-9 illustrate in cross-sectional form one form of a method for forming a multiple-bit nonvolatile memory device in accordance with the present invention.

Illustrated in FIG. 1 is a cross-sectional view of a process for making a semiconductor device 10 that implements two bits of data storage. Thus the illustrated portion of semiconductor device 10 is a multiple-bit or multi-bit memory cell. A semiconductor substrate 12 is provided. In one form the semiconductor substrate 12 is a silicon substrate. However, the semiconductor substrate 12 can be any semiconductor material or combinations of materials, such as gallium arsenide, silicon germanium, silicon-on-insulator (SOI), silicon, monocrystalline silicon, the like, and combinations of the above. Overlying the semiconductor substrate 12 is a first insulating layer such as oxide layer 14. The oxide layer 14 is thermally grown on semiconductor substrate 12 when the semiconductor substrate 12 is silicon. The oxide layer 14 will subsequently function as a gate oxide or gate dielectric.

Figure 2:
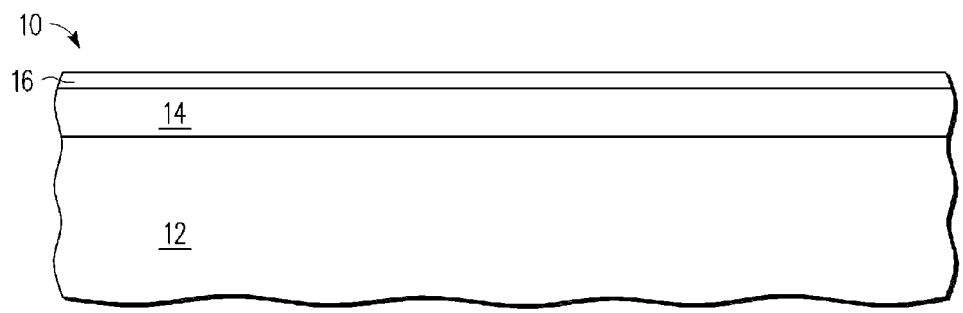

Illustrated in FIG. 2 is a cross-sectional view of semiconductor device 10 wherein a surface nitridation layer 16 is formed within the oxide layer 14 by a decoupled plasma nitridation (DPN) at the upper surface region such as within the upper ten Angstroms of oxide layer 14. The surface nitridation layer 16 forms a thin nitride layer within the oxide layer 14 so that oxide layer 14 has a nitrided top surface. The surface nitridation layer 16 provides various functions. The DPN process to introduce nitrogen into the upper portion of oxide layer 14 is conventional in semiconductor processing and therefore further details of this step will not be discussed. One of several functions that is provided by the surface nitridation layer 16 is the function of providing etch selectivity to overlying oxide layers which will be discussed below while at the same time having minimal electrical and chemical effect on the oxide layer 14. In other words this first insulating layer formed of oxide layer 14 has a top surface that is surface nitridation layer 16 which has an etch characteristic selective to oxide. Additionally, the surface nitridation layer 16 functions as an accurate etch endpoint which will be useful in subsequent processing. It should be understood that in other forms hafnium oxide ($HfO_2$) may be used to provide etch selectivity to overlying oxide layers rather than creating a nitrogen-rich layer at the surface of oxide layer 14. Alternately, other nitridation processes may be used. For example, instead of using a DPN process, a remote plasma nitridation (RPN) process may be used.

Figure 3:
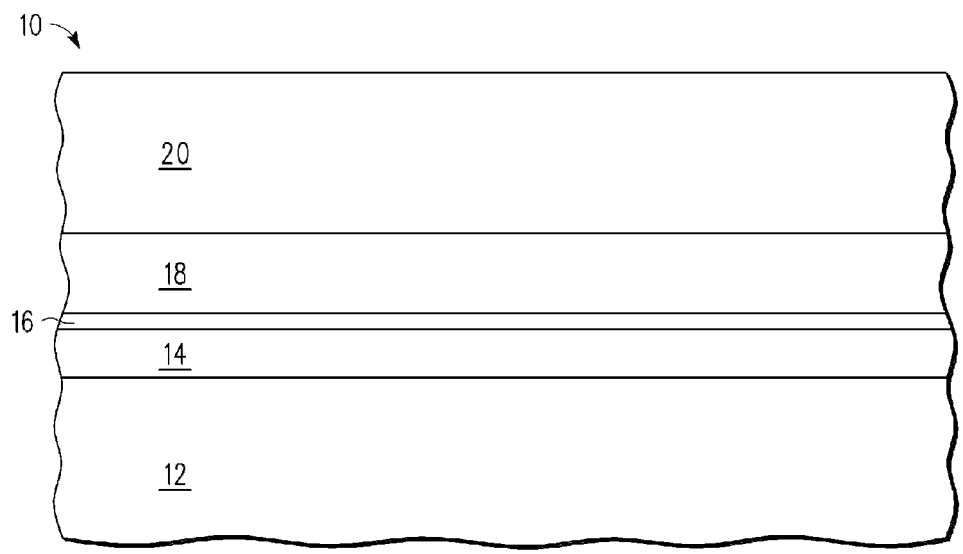

Illustrated in FIG. 3 is a cross-sectional view of semiconductor device 10 wherein an oxide layer 18 is deposited uniformly on the surface nitridation layer 16. The oxide layer 18 is deposited using a conventional deposition process and may be any of various oxides. Typically silicon dioxide is used for oxide layer 18. Overlying oxide layer 18 is a polysilicon layer 20 that is deposited conformally on the oxide layer 18 using a conventional deposition process. The polysilicon layer 20 is electrically conductive and forms a layer of gate material that will subsequently become a gate electrode or a gate portion of a memory storage device that is capable of storing a first bit and a second bit.

Figure 4:
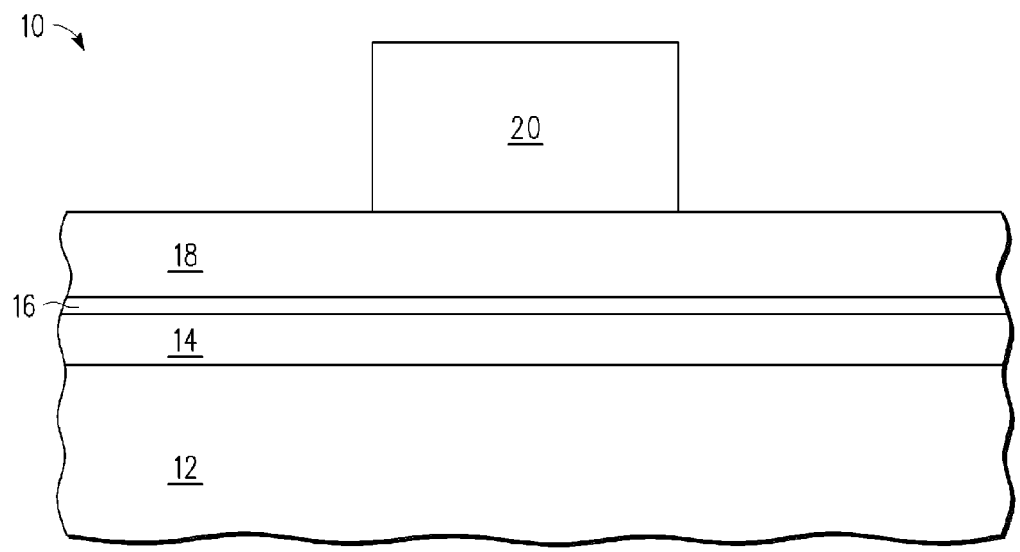

Illustrated in FIG. 4 is a cross-sectional view of semiconductor device 10 wherein the polysilicon layer 20 is selectively etched or removed using a mask such as a conventional masking layer (not shown). A conventional masking layer material is photoresist. The remaining portion of polysilicon layer 20 is patterned to have the desired width of a semiconductor transistor gate or control electrode. The etch is a conventional dry etch that is selective to oxide (i.e. will not consume any oxide material). Therefore the details of the chemistry of the etchant will not be further described.

Figure 5:
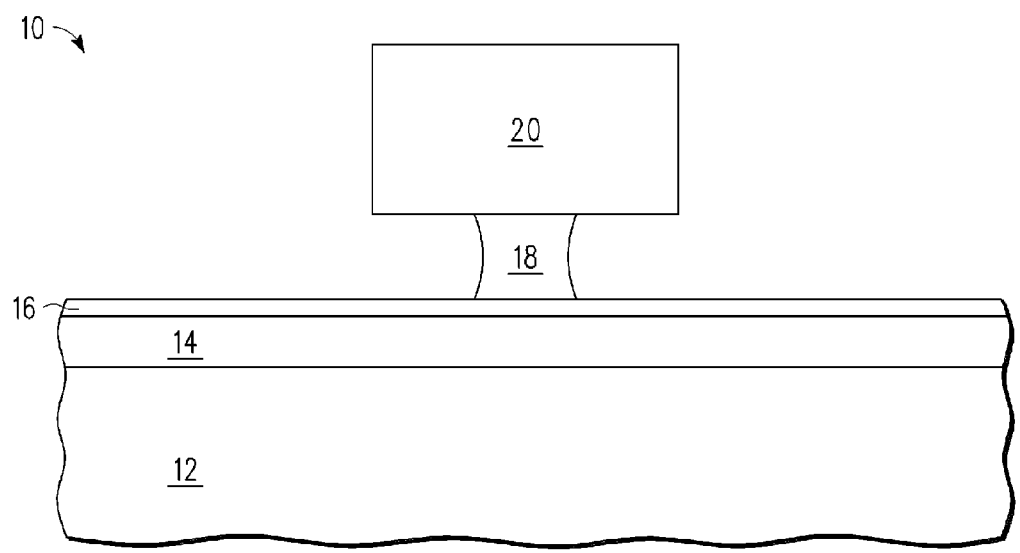

Illustrated in FIG. 5 is a cross-sectional view of semiconductor device 10 wherein an undercut region of the remaining portion of polysilicon layer 20 is created by performing a wet etch of the exposed surfaces of the deposited oxide layer 18 using dilute hydrofluoric acid, HF. The wet etch is stopped prior to complete consumption of the deposited oxide layer 18. Therefore a pedestal or support structure is left remaining that supports the remaining portion of polysilicon layer 20. The pedestal that is provided by the remainder of the deposited oxide layer 18 divides the exposed surface of the surface nitridation layer 16 into a first side and a second side (i.e. left and right sides). It should be noted that the amount of undercutting is permitted to be sufficient on each side to provide sufficient room to create charge storage regions on each side of the remainder of the polysilicon layer 20. While dimensions vary depending upon the specific semiconductor process and equipment being used, in one form the width of the undercut beneath polysilicon layer 20 on each side of the deposited oxide layer 18 is at least one hundred fifty (150) Angstroms or 15 nanometers. In one form the width of the undercut on each side of the deposited oxide layer 18 is between two hundred (200) and three hundred (300) Angstroms or between twenty and thirty nanometers. The etch process used to form the undercutting is a conventional wet etch that is selective to surface nitridation layer 16 (i.e. will not consume any surface nitrided material). Therefore the details of the chemistry of the etchant will not be further described.

Figure 6:
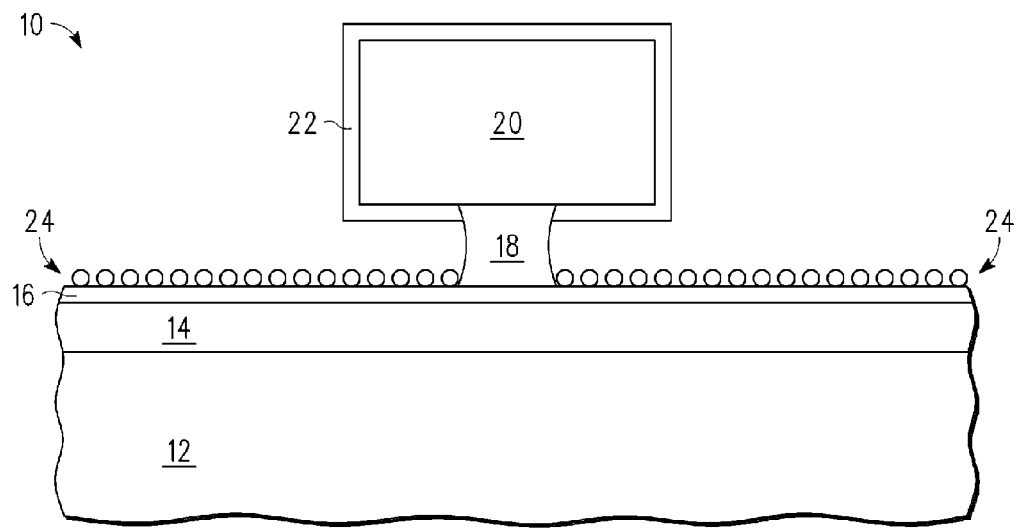

Illustrated in FIG. 6 is a cross-sectional view of semiconductor device 10 wherein an oxide layer 22 is grown around all exposed surfaces of the polysilicon layer 20. Oxide is grown around polysilicon layer 20 by a conventional process wherein the oxide grows on polysilicon when the polysilicon is exposed to an oxidizing ambient. Therefore, the oxide layer 22 forms not only on the upper and side surfaces of polysilicon layer 20 but also on the exposed bottom surfaces. It should be noted that the oxide layer 22 does not affect the exposed surface nitridation layer 16 overlying oxide layer 14. After formation of the oxide layer 22, a layer of nanoclusters 24 is formed on the exposed surface of the surface nitridation layer 16.

The nanoclusters 24 are, in one form, silicon nanoclusters and are deposited in a conventional manner. Therefore further detailed description of nanocluster formation will not be provided. It should be noted that the nanoclusters 24 selectively deposit on the surface nitridation layer 16 because of the use of hydrochloric acid (HCl) co-flow during deposition. The HCl gas etches any small nuclei that are formed on any exposed oxide surfaces. Another reason for selective deposition is the preferential nucleation of silicon clusters on nitrided surfaces as compared to oxide surfaces due to the difference in sticking coefficients of the silicon precursor on the two surfaces. It should be noted that while the nanoclusters 24 are illustrated as being symmetrical spheres for purposes of convenience of illustration, in reality the nanoclusters 24 may additionally be oblong or otherwise not symmetrical. It should however be noted that at this point in the processing there has been provided two physically separated regions of nanoclusters 24 that are underlying the polysilicon layer 20 that will function as a gate electrode of a memory cell. It should be understood that in some forms oxide layer 22 is optional. In such forms the polysilicon layer 20 is exposed at the time of nanocluster deposition. This results in additional polysilicon growth to the polysilicon layer 20 which grows by several Angstroms. Subsequent to the deposition of nanoclusters 24, a thin nitrided oxide shell (not shown) is conventionally grown around the nanoclusters 24 to protect the silicon of the nanoclusters from subsequent oxidation ambients in steps to be described below.

Figure 7:
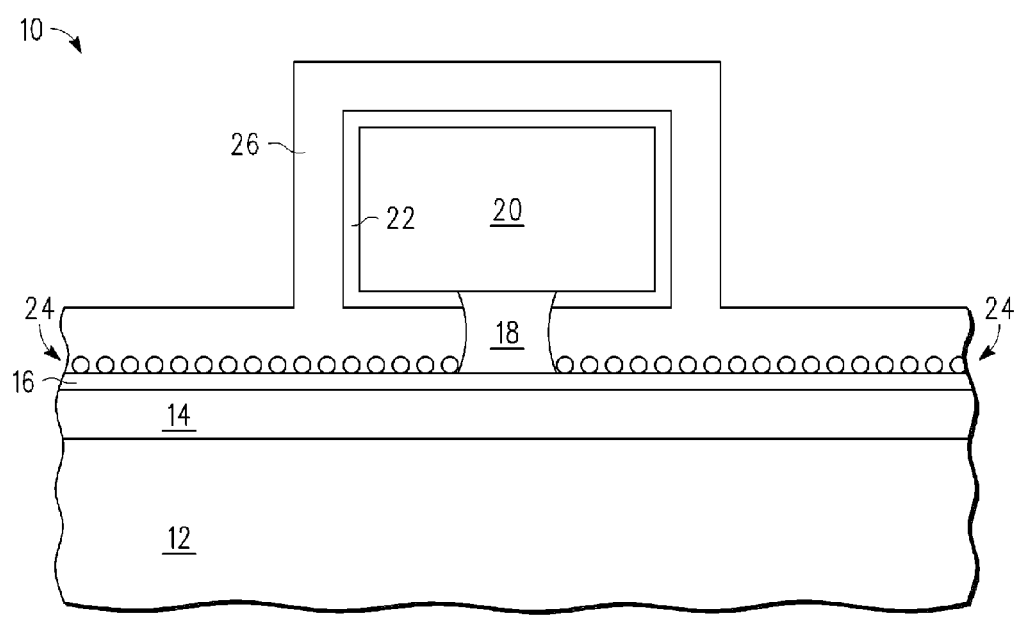

Illustrated in FIG. 7 is a cross-sectional view of semiconductor device 10 wherein an oxide layer 26 is conformally deposited onto semiconductor device 10. The oxide layer 26 is a high temperature oxide (HTO) and is a conventional oxide deposition. Therefore, further details of the oxide deposition will not be described.

Figure 8:
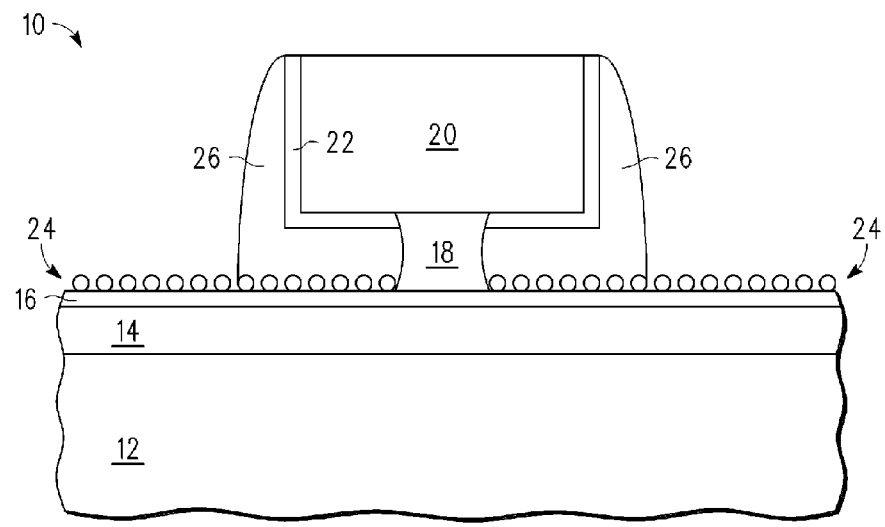

Illustrated in FIG. 8 is a cross-sectional view of semiconductor device 10 wherein sidewall formation of the memory cell is implemented. Sidewall spacers are formed by the anisotropic etching of oxide layer 26 to remove oxide layer 26 from the top surface of oxide layer 22 overlying polysilicon layer 20 and from the exposed horizontal surfaces of oxide layer 22 overlying the layer of nanoclusters 24. Because minimal etching of oxide layer 26 occurs in the lateral direction, the etching results in the formation of sidewall spacers to polysilicon layer 20 as illustrated in FIG. 8.

Figure 9:
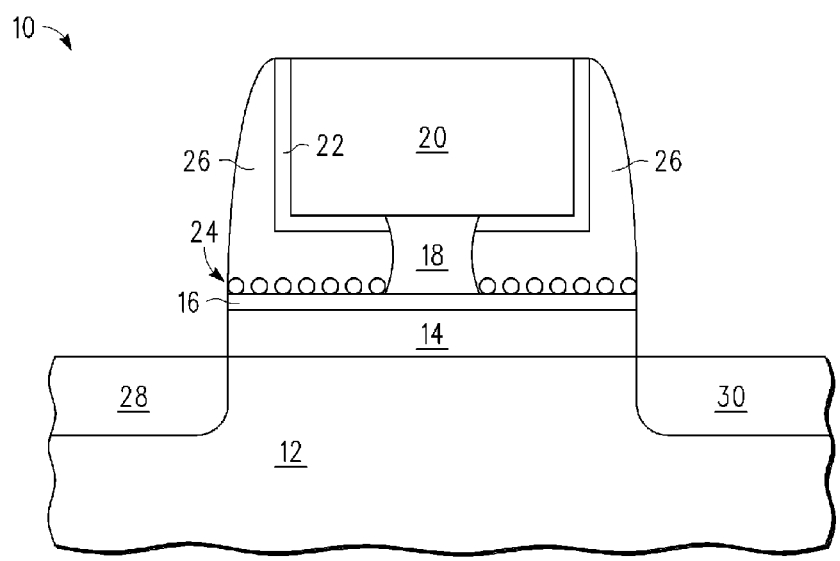

Illustrated in FIG. 9 is a cross-sectional view of semiconductor device 10 wherein further completion of a nonvolatile memory cell having storage regions for storing a logic state of a first bit and a logic state of a second bit is provided. An etch is performed to remove exposed portions of the layer of nanoclusters 24 and the subsequent exposed underlying portions of the surface nitridation layer 16 and oxide layer 14. The chemistry associated with the etch is dependent upon what materials are used for oxide layer 14 and the surface nitridation layer 16. In other words, if hafnium oxide is used in lieu of the surface nitridation layer 16, a different etch chemistry is required. It should be noted that the portion of oxide layer 14 and surface nitridation layer 16 that underlies the remaining polysilicon layer 20 and oxide layer 26 functions as a gate dielectric for a memory cell and polysilicon layer 20 functions as a gate. A conventional implantation of ions is performed into semiconductor substrate 12 to form a source region 28 and a drain region 30. The ion implant results in implanting source/drain dopants into semiconductor substrate 12. Exposed portions of the oxide layer 26, oxide layer 22 and polysilicon layer 20 block the implant ions and are not electrically modified by the ion implantation.

Figure 10:
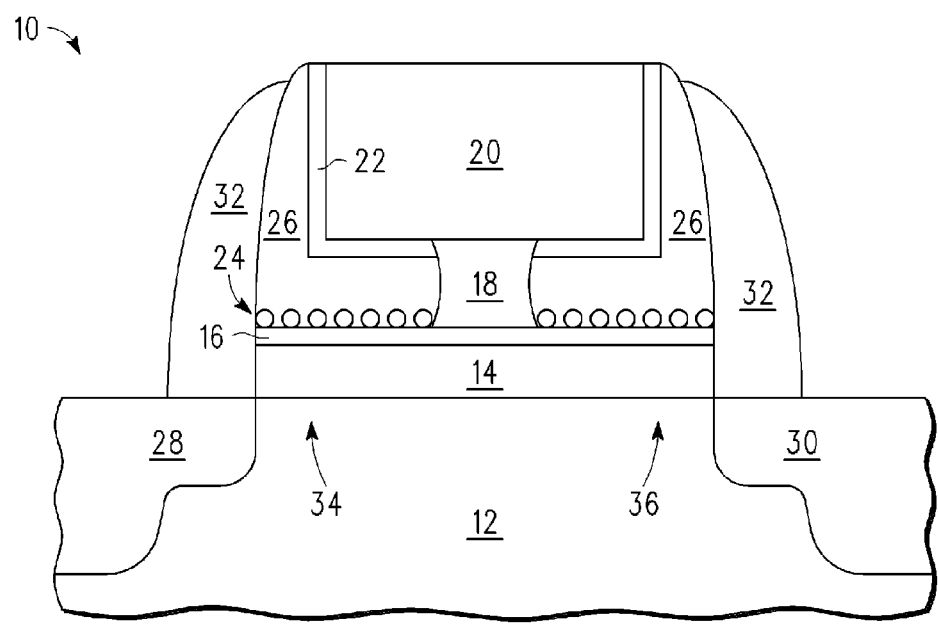

Illustrated in FIG. 10 is a cross-sectional view of semiconductor device 10 wherein a completed two-bit memory cell is provided. An additional sidewall spacer 32 is formed lateral to the oxide layer 26, the surface nitridation layer 16 and the oxide layer 14. Therefore sidewall spacer 26 and sidewall spacer 32 may be considered as two distinct adjacent sidewall spacers. Alternatively, the combination of sidewall spacer 32 and oxide layer 26 may be considered collectively as a composite sidewall spacer for the memory cell. A second ion implantation is performed which further implants the source region 28 and drain region 30. The additional implantation step increases the size of source region 28 and drain region 30 by making each region deeper in the areas illustrated in FIG. 10 and by bringing the source and drain closer in proximity to the channel region of the memory cell. Thus there has been provided as semiconductor device 10 a memory cell that is nonvolatile and that reliably stores two distinct data bits. The memory cell has a gate that is polysilicon layer 20, a source region 28, a drain region 30, a first memory bit 34 and a second memory bit 36. It should be understood that in another form the formation of sidewall spacer 32 and the second ion implantation is optional.

By now it should be appreciated that there has been provided a method for forming a semiconductor memory having two bits per memory cell while minimizing the total number of process steps and masking layers that are required. The two bits are physically isolated from each other so that there is reduced bit disturb and higher reliability. Because the gate oxide dielectric may be readily dimensioned to a variety of differing thicknesses, the process may readily accommodate a range of program and erase voltages without changing the number of processing steps. There is also improved reliability when the disclosed memory cell is used to store only a single memory bit because the storage area is confined to a small region that substantially matches the dimension of the charge injection zone during hot electron programming and hot hole erase operations.

In one form there is herein provided a method for forming a multi-bit memory cell using a semiconductor substrate. A first insulating layer is formed over the semiconductor substrate. A second insulating layer is formed over the first insulating layer. A layer of gate material is formed over the second insulating layer. The gate material is patterned to leave a gate portion of the layer of gate material. The second insulating layer is etched to undercut the gate portion and leave a portion of the second insulating layer between the first insulating layer and the gate portion. Nanocrystals are formed on the first insulating layer wherein a first portion of the nanocrystals is under the gate portion on a first side of the portion of the second insulating layer and a second portion of the nanocrystals is under the gate portion on a second side of the portion of the second insulating layer, whereby the first portion of the nanocrystals is for storing a logic state of a first bit and the second portion is for storing a logic state of a second bit. In one form a sidewall spacer is formed adjacent to the gate portion, the sidewall spacer covering a third portion of the nanocrystals adjacent to the first portion of the nanocrystals and covering a fourth portion of the nanocrystals adjacent to the second portion of nanocrystals. In another form an etchant that is useful in removing the nanocrystals is applied and the gate portion and the sidewall spacer are used as a mask. In another form an insulating layer is grown on the gate portion prior to forming the nanocrystals. In yet another form source/drain dopants are implanted into the semiconductor substrate using the gate portion and the sidewall spacer as a mask. In yet another form a second sidewall spacer is formed after the implanting. Source/drain dopants are implanted into the semiconductor substrate using the second sidewall spacer as a mask. In one form the forming of the first insulating layer is done by using hafnium oxide. In one form the first insulating layer has a top surface that has an etch characteristic which is selective to oxide. In another form the first insulating layer is formed by forming an oxide layer on the semiconductor substrate and performing a decoupled plasma nitridation on the oxide layer. In another form forming the first insulating layer is further characterized by having a top surface that has an etch characteristic selective to oxide.

In yet another form there is provided a method for forming a multi-bit memory cell using a semiconductor substrate. A first insulating layer having a nitrided top surface is formed over the semiconductor substrate. A second insulating layer is formed over the first insulating layer, wherein the second insulating layer is selectively etchable with respect to the nitrided top surface of the first insulating layer. A polysilicon layer is formed over the second insulating layer. The polysilicon layer is patterned to leave a gate portion of the polysilicon layer. Hydrofluoric acid is applied to the second insulating layer to undercut the gate portion and leave a portion of the second insulating layer between the first insulating layer and the gate portion. Nanocrystals are formed over the first insulating layer wherein a first portion of the nanocrystals is under the gate portion on a first side of the portion of the second insulating layer and a second portion of the nanocrystals is under the gate portion on a second side of the portion of the second insulating layer. In this form the first portion of the nanocrystals is for storing a logic state of a first bit and the second portion of the nanocrystals is for storing a logic state of a second bit. In one form forming the first insulating layer is implemented by performing decoupled plasma nitridation to achieve the nitrided top surface. In another form forming the second insulating layer is done by performing a high temperature oxide deposition, wherein the second insulating layer is thicker than the first insulating layer. In yet another form a sidewall spacer is formed adjacent to the gate portion and covers both a third portion of the nanocrystals adjacent to the first portion of the nanocrystals and a fourth portion of the nanocrystals adjacent to the second portion of nanocrystals. Source/drain dopants are implanted into the substrate using the gate portion and the sidewall spacer as a mask. In another form an oxide layer is grown on the gate portion prior to forming the nanocrystals.

In yet another form there is provided a method for forming a multi-bit memory cell using a semiconductor substrate. A first oxide layer is grown on the semiconductor substrate. A decoupled plasma nitridation of the first oxide layer is performed. A second oxide layer is deposited overlying the first oxide layer. A layer of gate material is formed overlying the second oxide layer. The gate material is patterned to leave a gate portion of the layer of gate material. Hydrofluoric acid is applied to the second oxide layer for a duration that is sufficiently long to undercut the gate portion at least 150 Angstroms and expose portions of the first oxide layer. Nanocrystals are formed on the first oxide layer. In another form a first portion of the nanocrystals is formed under a first side of the gate portion and a second portion of the nanocrystals is formed under a second side of the gate portion. In yet another form a sidewall spacer is formed adjacent to the gate portion. The sidewall spacer covers a third portion of the nanocrystals adjacent to the first portion of the nanocrystals and covers a fourth portion of the nanocrystals adjacent to the second portion of nanocrystals. In yet another form source/drain dopants are implanted into the semiconductor substrate using the gate portion and the sidewall spacer as a mask. In yet another form a second sidewall spacer is formed after implanting, and source/drain dopants are implanted into the semiconductor substrate using the second sidewall spacer as a mask.

Although the invention has been described with respect to specific conductivity types or polarity of potentials, skilled artisans appreciated that conductivity types and polarities of potentials may be reversed. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a dual-bit or a single-bit memory cell may be utilized with the resulting structure created by the methods described herein. Various substrate materials may be used and the type of material used at the surface of oxide layer 14 may vary. Additionally, various semiconductor materials may be used for the nanoclusters. The terms nanoclusters, nanocrystals and nanodots are intended to be used interchangeably herein. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a multi-bit memory cell using a semiconductor substrate, comprising:
    forming a first insulating layer over the semiconductor substrate;
    forming a second insulating layer over the first insulating layer;
    forming a layer of gate material over the second insulating layer;
    patterning the gate material to leave a gate portion of the layer of gate material;
    etching the second insulating layer to undercut the gate portion and leave a portion of the second insulating layer between the first insulating layer and the gate portion; and
    forming nanocrystals on the first insulating layer wherein a first portion of the nanocrystals is under the gate portion on a first side of the portion of the second insulating layer and a second portion of the nanocrystals is under the gate portion on a second side of the portion of the second insulating layer, whereby the first portion of the nanocrystals are for storing a logic state of a first bit and the second portion is for storing a logic state of a second bit.

2. The method of claim 1, further comprising forming a sidewall spacer adjacent to the gate portion, the sidewall spacer covering a third portion of the nanocrystals adjacent to the first portion of the nanocrystals and covering a fourth portion of the nanocrystals adjacent to the second portion of nanocrystals.

3. The method of claim 2, further comprising applying an etchant useful in removing the nanocrystals using the gate portion and the sidewall spacer as a mask.

4. The method of claim 3 further comprising growing an insulating layer on the gate portion prior to forming the nanocrystals.

5. The method of claim 4, further comprising implanting source/drain dopants into the semiconductor substrate using the gate portion and the sidewall spacer as a mask.

6. The method of claim 5, further comprising:
    forming a second sidewall spacer after the implanting; and
    implanting source/drain dopants into the semiconductor substrate using the second sidewall spacer as a mask.

7. The method of claim 6, wherein the forming of the first insulating layer is further characterized by the first insulating layer comprising hafnium oxide.

8. The method of claim 6, wherein the forming of a first insulating layer is further characterized by having a top surface that has an etch characteristic selective to oxide.

9. The method of claim 1, wherein the forming of the first insulating layer comprises:
    forming an oxide layer on the semiconductor substrate; and
    performing a decoupled plasma nitridation on the oxide layer.

10. The method of claim 1, wherein forming a first insulating layer is further characterized by having a top surface that has an etch characteristic selective to oxide.

11. A method for forming a multi-bit memory cell using a semiconductor substrate, comprising:
    forming a first insulating layer over the semiconductor substrate, the first insulating layer having a nitrided top surface;
    forming a second insulating layer over the first insulating layer, wherein the second insulating layer is selectively etchable with respect to the nitrided top surface of the first insulating layer;
    forming a polysilicon layer over the second insulating layer;
    patterning the polysilicon layer to leave a gate portion of the polysilicon layer;
    applying hydrofluoric acid to the second insulating layer to undercut the gate portion and leave a portion of the second insulating layer between the first insulating layer and the gate portion; and
    forming nanocrystals over the first insulating layer wherein a first portion of the nanocrystals is under the gate portion on a first side of the portion of the second insulating layer and a second portion of the nanocrystals is under the gate portion on a second side of the portion of the second insulating layer, whereby the first portion of the nanocrystals are for storing a logic state of a first bit and the second portion of the nanocrystals is for storing a logic state of a second bit.

12. The method of claim 11, wherein forming the first insulating layer comprises performing decoupled plasma nitridation to achieve the nitrided top surface.

13. The method of claim 11, wherein forming the second insulating layer comprises performing a high temperature oxide deposition, wherein the second insulating layer is thicker than the first insulating layer.

14. The method of claim 11, further comprising:
    forming a sidewall spacer adjacent to the gate portion that covers a third portion of the nanocrystals adjacent to the first portion of the nanocrystals and covers a fourth portion of the nanocrystals adjacent to the second portion of nanocrystals; and
    implanting source/drain dopants into the substrate using the gate portion and the sidewall spacer as a mask.

15. The method of claim 14, further comprising growing an oxide layer on the gate portion prior to forming the nanocrystals.

16. A method for forming a multi-bit memory cell using a semiconductor substrate, comprising:
    growing a first oxide layer on the semiconductor substrate;
    performing a decoupled plasma nitridation on the first oxide layer;
    depositing a second oxide layer overlying the first oxide layer;
    forming a layer of gate material overlying the second oxide layer;
    patterning the gate material to leave a gate portion of the layer of gate material;
    applying hydrofluoric acid to the second oxide layer for a duration sufficiently long to undercut the gate portion at least 150 Angstroms and expose portions of the first oxide layer; and
    forming nanocrystals on the first oxide layer.

17. The method of claim 16, wherein forming the nanocrystals further comprises forming a first portion of the nanocrystals under a first side of the gate portion and forming a second portion of the nanocrystals under a second side of the gate portion.

18. The method of claim 17, further comprising forming a sidewall spacer adjacent to the gate portion, the sidewall spacer covering a third portion of the nanocrystals adjacent to the first portion of the nanocrystals and covering a fourth portion of the nanocrystals adjacent to the second portion of nanocrystals.

19. The method of claim 18, further comprising implanting source/drain dopants into the semiconductor substrate using the gate portion and the sidewall spacer as a mask.

20. The method of claim 19, further comprising:

forming a second sidewall spacer after the implanting; and implanting source/drain dopants into the semiconductor substrate using the second sidewall spacer as a mask.

* * * * *